(12) United States Patent
Birnstock et al.

(10) Patent No.: US 9,178,173 B2
(45) Date of Patent: Nov. 3, 2015

(54) ORGANIC LIGHT EMITTING DEVICE

(75) Inventors: Jan Birnstock, Dresden (DE); Martin Vehse, Ganderkesee (DE); Tobias Canzler, Dresden (DE); Senthilkumar Madasamy, Chennai (IN); Omrane Fadhel, Dresden (DE); Domagoj Pavicic, Dresden (DE); Carsten Rothe, Dresden (DE); Sven Murano, Dresden (DE)

(73) Assignee: NOVALED AG, Dresden (DE)

( * ) Notice: Subject to any disclaimer, the term of this patent is extended or adjusted under 35 U.S.C. 154(b) by 54 days.

(21) Appl. No.: 13/704,135

(22) PCT Filed: Jun. 10, 2011

(86) PCT No.: PCT/EP2011/002869
§ 371 (c)(1),
(2), (4) Date: Aug. 23, 2013

(87) PCT Pub. No.: WO2011/157385
PCT Pub. Date: Dec. 22, 2011

(65) Prior Publication Data
US 2013/0320307 A1 Dec. 5, 2013

(30) Foreign Application Priority Data

Jun. 14, 2010 (DE) .......................... 10 2010 023 620
Jun. 14, 2010 (EP) ..................................... 10006125
Dec. 14, 2010 (EP) ..................................... 10195023

(51) Int. Cl.
*H01L 51/50* (2006.01)
*H01L 51/00* (2006.01)
(Continued)

(52) U.S. Cl.
CPC .......... *H01L 51/5048* (2013.01); *H01L 51/009* (2013.01); *H01L 51/0071* (2013.01);
(Continued)

(58) Field of Classification Search
CPC . H01L 51/50; H01L 27/3209; H01L 51/0071; H01L 51/0084; H01L 51/009
USPC ............................................................ 257/40
See application file for complete search history.

(56) References Cited

U.S. PATENT DOCUMENTS 5,093,698 A    3/1992 Egusa
6,693,296 B1   2/2004 Tyan
(Continued)

FOREIGN PATENT DOCUMENTS

EP    1 804 308 A1    1/2006
EP    1 804 309 A1    1/2006
(Continued)

OTHER PUBLICATIONS

Ho et al., "Low Glass Transition Temperature (Tg) Rubber Latex Film Formation Studied by Atomic Force Microscopy," Langmuir, 2000, 16:2436-2449.

(Continued)

*Primary Examiner* — Karen Kusumakar
*Assistant Examiner* — Adam S Bowen
(74) *Attorney, Agent, or Firm* — Sutherland Asbill & Brennan LLP

(57) ABSTRACT

The present invention relates to an organic light emitting device that includes a layered structure including a substrate, a bottom electrode and a top electrode, wherein the bottom electrode is closer to the substrate than the top electrode, the region between the bottom electrode and the top electrode defining an electronically active region, wherein the electronically active region includes a scattering layer having a thickness of less than 50 nm; and an organic light emitting device additionally having at least one light emitting layer in the electronically active region, and this device can also include a specific chemical compound outside of the electronically active region.

9 Claims, 2 Drawing Sheets

(51) Int. Cl.
*H01L 51/52* (2006.01)
*H01L 27/32* (2006.01)

(52) U.S. Cl.
CPC ........ *H01L51/0084* (2013.01); *H01L 51/5268* (2013.01); *H01L 27/3209* (2013.01); *H01L 51/0072* (2013.01); *H01L 51/0085* (2013.01); *H01L 51/5016* (2013.01); *H01L 51/5036* (2013.01); *H01L 51/5052* (2013.01)

(56) References Cited

U.S. PATENT DOCUMENTS

| | | | |
|---|---|---|---|
| 6,908,783 | B1 | 6/2005 | Kuehl et al. |
| 6,910,933 | B1* | 6/2005 | Matsuo et al. .................. 445/24 |
| 7,074,500 | B2 | 7/2006 | Pfeiffer et al. |
| 7,345,300 | B2 | 3/2008 | Qin et al. |
| 7,911,129 | B2 | 3/2011 | Hofmann et al. |
| 7,986,090 | B2 | 7/2011 | Pfeiffer et al. |
| 8,258,501 | B2 | 9/2012 | Werner et al. |
| 8,482,193 | B2 | 7/2013 | Kido et al. |
| 9,018,834 | B2 | 4/2015 | Ide et al. |
| 2006/0220539 | A1* | 10/2006 | Cok et al. ..................... 313/506 |
| 2006/0250076 | A1 | 11/2006 | Hofmann et al. |
| 2007/0051946 | A1 | 3/2007 | Walzer et al. |
| 2007/0114523 | A1* | 5/2007 | Oumi et al. ..................... 257/40 |
| 2007/0247061 | A1 | 10/2007 | Adamovich et al. |
| 2008/0048557 | A1* | 2/2008 | Birnstock et al. ............. 313/504 |
| 2008/0164807 | A1 | 7/2008 | Hofmann et al. |
| 2008/0203406 | A1 | 8/2008 | He et al. |
| 2008/0265216 | A1 | 10/2008 | Hartmann et al. |
| 2009/0009072 | A1 | 1/2009 | Wellmann et al. |
| 2009/0045728 | A1 | 2/2009 | Murano et al. |
| 2010/0224313 | A1 | 9/2010 | Chari et al. |
| 2011/0062481 | A1 | 3/2011 | Oyamada |
| 2011/0108772 | A1 | 5/2011 | Zeika et al. |
| 2011/0210323 | A1 | 9/2011 | Imai |
| 2011/0309307 | A1 | 12/2011 | Zeika et al. |
| 2012/0025171 | A1 | 2/2012 | Canzler et al. |

FOREIGN PATENT DOCUMENTS

| | | |
|---|---|---|
| EP | 1 734 792 A1 | 12/2006 |
| EP | 2 287 939 A1 | 5/2008 |
| JP | 7310071 A | 11/1995 |
| JP | 2003272860 A | 9/2003 |
| JP | 2008242060 A | 10/2008 |
| JP | 2009534846 A | 9/2009 |
| JP | 2010514174 A | 4/2010 |
| JP | 2010118381 A | 5/2010 |
| WO | 2005094130 A1 | 10/2005 |
| WO | 2005/106987 A1 | 11/2005 |
| WO | 2010058737 A1 | 5/2010 |

OTHER PUBLICATIONS

Notification of Reasons for Refusal for corresponding Japanese Application No. 2013-514577 mailed Mar. 31, 2015.

* cited by examiner

| 14 |
|---|
| 13 |
| 12 |
| 11 |
| 10 |

Fig.1

| 25 |
|---|
| 24 |
| 23 |
| 22 |
| 21 |
| 20 |

Fig.2

| 34 |
|---|
| 33 |
| 32 |
| 31 |
| 30 |

Fig.3

ORGANIC LIGHT EMITTING DEVICE

Organic semiconductors are used in the production of simple electronic components e.g. resistors, diodes, field effect transistors, and also optoelectronic components like organic light emitting devices (e.g. OLED (organic light emitting diodes)), and many others. The industrial and economical significance of the organic semiconductors and their devices is reflected in the increased number of devices using organic semiconducting active layers and the increasing industry focus on the subject.

Organic semiconductor devices are made by layers; such organic semiconducting layers mainly comprise conjugated organic compounds, which can be small molecules, for instance monomers, or oligomers, polymers, copolymers, copolymers of conjugated and non-conjugated blocks, completely or partially cross-linked layers, aggregate structures, or brush like structures. A device made with different types of compounds, in different layers or mixed together, for example with polymer and small molecule layers, is also called a polymer—small molecule hybrid device. OLEDs are preferentially made of small molecules because the deposition techniques involved in fabricating small molecule OLEDs enable the fabrication of multilayer structures.

Since 1987, large efforts were undertaken worldwide by research groups and by industrial organizations to improve the performance of OLEDs, especially of small molecule OLEDs. One of the first quests was to find suitable organic semiconductor materials made of small molecules which are able to form homogeneous layers. Nowadays, charge carrier transporting materials for industrial use are morphologically stable at least to the temperature of 85° C., typical materials have glass transition temperatures above 100° C. At the same time the materials need to fulfill a set of other requirements, such as high transparency in the visible spectrum and good charge transporting abilities.

Most of the good performance electron or hole transport materials are relatively high cost materials mainly due to their complex synthetic route, which presents a problem to be solved.

Another problem to be solved is the enhancement of the outcoupling efficiency of OLEDs to be used in lighting. Typical organic light-emitting diodes have the disadvantage that only about 25% of the light produced is emitted from the device. About 50% of the light remains as internal modes in the arrangement of organic layers located between the reflecting electrode and the semitransparent electrode. A further 20% is lost due to total reflection in the substrate. The reason for this is that the light inside an OLED is formed in optical media having a refractive index of about 1.6 to 1.8. If this light now impinges upon an optical medium having a lower refractive index, for example, another layer inside an OLED stack, the substrate on which the OLED is formed or one of the electrodes, total reflection occurs if a certain value of the angle of incidence is exceeded. For improving outcoupling, several different techniques are used, for instance, micro lenses array, as described, e.g. in US2010/0224313 A1. However such techniques require further development because light extraction efficiency is still far from 100%.

For the use of white OLEDs in lighting technology, it is therefore necessary to use suitable outcoupling methods which could furthermore be incorporated inexpensively in the fabrication process. It is assumed that, for lighting applications, an OLED area of 1 cm² must only cost a few cents in order for its application to be economically reasonable. This means, however, that only particularly inexpensive methods come into consideration at all for increasing the light outcoupling. OLEDs based on so-called small molecules (SM) are nowadays processed with, i.a., the aid of thermal evaporation in vacuum. Typically, OLEDs consist of two to twenty layers which are all individually thermally vapour-deposited. If the outcoupling can now be significantly improved by means of just one more single thermally vapour-deposited layer, the condition on the costs of the outcoupling method will be satisfied in any case. The same applies to SM-polymer hybrid OLEDs.

For applications of OLEDs as lighting elements, it is furthermore necessary to make the devices having a large-area. For instance, if an OLED is operated at a brightness of 1000 cd/m², areas in the range of a few square meters are required to illuminate an office space.

SUMMARY OF THE INVENTION

The invention shall solve the problem of providing an OLED with improved outcoupling efficiency, while maintaining a simple device structure and a simple manufacturing method.

It is a further objective of this invention to provide an alternative to the state of the art electron transport materials, and OLEDs employing this alternative. The alternative is a material with an easier synthesis, therefore lower cost, which at the same time delivers higher performance when used in OLEDs. An objective of the invention is also to provide a low cost material to be used as electron transport material (ETM), as doped electron transport material, and/or as an optical scattering material in an OLED stack. Alternatively or in addition, the material can be used outside the OLED stack (in this case, adjacent to one of the electrode but not in between the two electrodes) as an optical outcoupling material such as an scattering material.

This object is achieved, in embodiments, by an organic light emitting device comprising a layered structure including a substrate, a bottom electrode and a top electrode, wherein the bottom electrode is closer to the substrate than the top electrode, the region between the bottom electrode and the top electrode defining an electronically active region, wherein the electronically active region comprises a scattering layer having a thickness of less than 50 nm. In other embodiments, this object is achieved by an organic light emitting device comprising a layered structure including a substrate, a bottom electrode and a top electrode, wherein the bottom electrode is closer to the substrate than the top electrode, the region between the bottom electrode and the top electrode defining an electronically active region, with at least one light emitting layer in the electronically active region, the device further comprising a chemical compound according to formula (I):

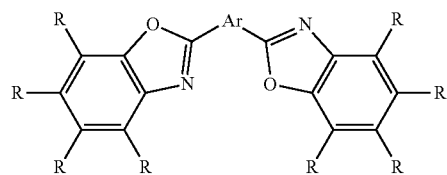

wherein Ar is $C_6$-$C_{20}$ aryl and each R is independently selected from H, $C_1$-$C_{20}$ alkyl, preferably $C_1$-$C_{10}$ alkyl, more preferably $C_1$-$C_5$ alkyl, $C_6$-$C_{20}$ aryl, preferably $C_6$-$C_{12}$ aryl, $C_5$-$C_{20}$ heteroaryl, preferably $C_5$-$C_{12}$ hereroaryl, halogen, nitro, CN and amine, and wherein a layer comprising the compound according to formula (I) is outside of the electronically active region.

In a most preferred embodiment, an organic light emitting device with an electron transport layer is preferred compared to device with a hole transport layer.

By searching for an optimal, low cost transport material ETM, it was found that the compounds according to formula (I) have very specific thermal properties, meaning they have no measurable glass transition temperature (Tg) and they form very rough, crystallized layers. By doing OLED experiments it was surprisingly found, against all expectations, that the OLEDs have a very good performance. Further analysis has shown that the fact that the compounds according to formula (I) form very rough layers does increase the performance of the OLEDs, instead of deteriorating the performance and damaging the OLED. This is in strong contradiction to the conventional belief that the materials must have a high Tg.

According to a second objective of the invention, it is provided a bottom-emitting device having an improved light outcoupling, which can be produced cost-effectively and which is suitable for a mass production process.

According to the invention is also a bottom-emitting organic device, in particular an organic light-emitting diode comprising an arrangement of stacked layers on a substrate, the arrangement of stacked layers comprising:
  a bottom electrode, which is optically transparent,
  a top electrode, which is reflecting,
  a layered structure which is formed with at least one organic light-emitting layer between the bottom electrode and the top electrode and in electrical contact therewith, and
  a roughening organic layer, which consists of a self-crystallising organic material and which is formed in the layered structure neighbouring the top electrode and roughening an electrode surface of the top electrode on the side facing the layered structure.

According to another objective of the invention, the invention concerns an OLED comprising an arrangement of stacked layers on a substrate, the arrangement of stacked layers comprising:
  a bottom electrode;
  a top electrode;
  a layered structure, comprising at least one light emitting layer, between and formed in electrical contact to the bottom electrode and the top electrode, and
  a roughening organic layer, which is formed from an self-crystallizing organic material and which serves as a template providing a surface roughness to the surface of the top electrode which is facing the layered structure.

According to a further objective of the invention, the invention concerns an arrangement of organic semiconducting layers comprising:
  a first electron transport layer;
  a roughening organic layer which is also electron transporting and is adjacent to the first electron transport layer;
  a second electron transport layer, which arrangement of organic semiconducting layers can be applied to any of the layered structures disclosed in the present invention.

Preferably, the roughening organic layer comprises a chemical compound according to formula (I). According to the present invention, a roughening layer is to be understood as a scattering layer which serves as a template for a layer which is deposited on top. In contrast, the top scattering layer, i.e. on top, outside of the electrodes, cannot be considered as a roughening layer, because there is no other layer on top of it.

DETAILS OF THE INVENTION

A preferred organic light emitting device according to the invention comprises preferably a layered structure including among others, a substrate, a bottom electrode, and a top electrode, wherein the bottom electrode is closer to the substrate than the top electrode, wherein the region between the bottom electrode and the top electrode defines an electronically active region, and at least one light emitting layer in the electronically active region, the organic light emitting device comprising a scattering compound having the following characteristics:
  a glass transition temperature of below 40° C., preferred is a Tg<RT (300K), in fact they do not present any measurable glass transition temperature at temperatures above room temperature or have no Tg at all;
  a high transparency also defined as a low extinction coefficient (smaller than 0.1) for all visible light;
  No apparent color;
  A HOMO-LUMO gap of at least 3 eV;
  Preferably, the material is transparent in the visible region (optical gap >3 eV)
  A LUMO between 2.0 and 4.0 eV, which is typical for ETMs used in OLEDs, or a HOMO between 4.5 and 6.0 eV which is typical for HTMs;
  do not form amorphous layers (for instance by using VTE or OVPD)., more preferred is a non-measurable Tg, i.e. the material does not present a Tg at all under conventional measurements.
  The molecular mass is greater than 200 g/mol and smaller than 400 g/mol (<200 g/mol are compounds with too high volatility and >400 g/mol are compounds which do not crystallize sufficiently).
  A compound which comprises 3 aromatic units which are not condensated to each other, enabling independent rotation of any of the 3 units.

Scattering Layer

In one preferred embodiment of the invention, the organic light emitting device comprises the compound according to formula (I) outside of the electronically active region (meaning it is not used as an ETL). In this embodiment, the compound is preferentially used in a scattering layer to provide mixture and/or improve the outcoupling of light. In one embodiment, this scattering layer is composed by the compound according to formula (I). A "scattering layer" in this text refers to a layer comprising the compound according to formula (I).

In another preferred embodiment, the OLED has a scattering layer on a transparent top electrode, an OLED with a transparent top electrode is called a top emitting OLED. The scattering layer is on the side which faces away from the substrate, i.e., it is not in between the top and bottom electrodes. Top emitting OLEDs are describes in e.g. WO2005106987, EP1739765. In one preferred embodiment, the scattering layer is in direct contact with the top electrode.

In another embodiment, the scattering layer is the last layer of the stack, till being closer to the top electrode than the bottom electrode. In this embodiment, another functional layer, such as an index matching layer or a thin film encapsulation can be formed between the top electrode and the scattering layer. A "stack" as used in this text, refers to a monolithic stack of solid layers, there is no gas or liquid layer between the stack.

In another embodiment, the compound according to formula (I) is used in a layer between the substrate and the bottom electrode in a bottom emitting OLED. This layer improves the light outcoupling from the electronic active region into the substrate, enhancing the OLED's overall efficiency.

It is preferred that the scattering layer has a nominal (or average) thickness on the order of the dimension of the wavelength of the visible light, preferred is a thickness between 100 nm and 1 µm. In this range of thicknesses the light can be in-coupled from the organic layers, from the electrodes, or from the substrate into the scattering layer and out-coupled of the device with a high efficiency.

The thickness of the scattering layer is the nominal thickness, such thickness is usually calculated from the mass deposited on a certain area by the knowledge of the material's density. For example, with vacuum thermal evaporation VTE, the nominal thickness is the value indicated by the thickness monitor equipment. In reality, since the layer is not homogeneous and not flat at least at one interface, its final thickness is difficult to measure, in this case, the average value can be used.

Electron Transport Layer

In accordance to the invention, the scattering compound is used in a semiconducting layer which is formed in between the top and bottom electrodes of an OLED. In a preferred embodiment the electronically active region of the OLED comprises the compound according to formula (I). It is further preferred that the compound is used in the electronically active region but not the light emitting layer.

A light emitting layer is a layer where the excitons which take part in light emission are formed and/or in which the excitons recombine emitting light. Possible light emitting layers are described e.g. EP1508176, US2008203406, EP1705727, US6693296. Different possible arrangements of light emitting layers in an OLED are described e.g in EP1804308, EP1804309. In specific cases, the charge carrier injection and the charge carrier transport, are highly balanced and an OLED can be made with a single layer EP 1713136, in such a case, the light emitting layer does not need to have a sharp interface, the region comprising excitons which take part in the light emission is the light emitting layer.

In one preferred embodiment, the organic light emitting device comprises the scattering compound in a layer between the at least one light emitting layer and the top electrode. Preferentially, this top electrode is a cathode.

In case the OLED has a stack of light emitting layers, it is preferred that the scattering compound is comprised in between the cathode and the light emitting layer which is the closest light emitting layer to the cathode.

The OLED can be a top emitting OLED or a bottom emitting OLED, however it is preferentially a bottom emitting OLED. It was found that on bottom emitting OLEDs the enhancement of efficiency by using a scattering compound is higher than for top emitting OLEDs. Despite that an enhancement of efficiency was found for different types of electrodes, it is preferred that the cathode is a metal layer, in this case, the improvements are higher than for transparent conductive oxides (TCOs).

In another, optional embodiment, the organic light emitting device comprises the scattering compound in a layer which is formed in between the at least one light emitting layer and the bottom electrode. Preferentially, this OLED is an inverted OLED, the bottom electrode being a cathode.

For use of the scattering compound in the electronically active region of an OLED, it is preferred that the nominal layer thickness is less than 50 nm, even more preferably less than 10 nm. If the layer comprising the scattering compound serves as a template it was found that the best device performance is obtained when the roughening layer is provided between a first and a second electron transport layer, and wherein the thickness of the roughening layer is greater or equal to 3 nm and smaller or equal to 30 nm, preferably between 5 nm and 15 nm. The equivalent applies for an scattering compound which is hole transporting, in that case it is preferred that the roughening layer is provided between a first and a second hole transport layer, with same layer thickness as above.

For use of the scattering compound in the electronically active region of an OLED, it is preferred that the OLED comprises electrically doped transport layers.

For use of the scattering compound in the electronically active region of an OLED, it is preferred that the scattering compound is electrically doped with a n-dopant, in case of an ETM, and doped with a p-dopant in case of an HTM.

In alternative or in addition, to the embodiments above, the layer comprising the scattering compound is preferably adjacent to a top doped transport and/or injection layer. "Top" means it is further away from the substrate than the layer comprising the scattering compound.

The roughening layer comprises a electron transport material as its main constituent (the main constituent is also called "matrix material")

The roughening material is also a scattering material consequently the roughening layer is also a scattering layer.

The first or the second electron transport layers are independently selected from: hole blocking layer (HBL), electron transport layer (ETL), electrically n-doped electron transport layer (n:ETL), wherein any of these layers, HBL, ETL, n:ETL can also be used as electron injection layer. The roughening layer can further comprise an n-dopant which is capable of electrically n-dope the matrix material.

For example the roughening layer can be provided in the following layer configuration, which layer configuration is part of the arrangement of layers: HBL/roughening layer/n:ETL, wherein the first transport layer (HBL) and the second transport layer (n:ETL) comprise the same or different matrix materials. Where "/" designates a touching contact, i.e., no other layer in between.

The first or the second hole transport layers are independently selected from: electron blocking layer (EBL), hole transport layer (HTL), electrically p-doped hole transport layer (p:HTL), wherein any of these layers, EBL, HTL, p:HTL can also be used as hole injection layer.

For example the roughening layer can be provided in the following layer configuration, which layer configuration is part of the arrangement of layers: EBL/roughening layer/p:HTL, wherein the first transport layer (EBL) and the second transport layer (p:HTL) comprise the same or different matrix materials. The roughening layer can further comprise a p-dopant which is capable of electrically p-dope the matrix material.

The roughening layer can further comprise an n-dopant which is capable of electrically n-dope It was also found that specific energy level alignment between the roughening layer and the first and second transport layers favor highest efficiency.

In case the roughening layer is electron transporting (it comprises an electron transport material as its matrix material) it is preferred that the LUMO energy level differences between the first transport layer and the roughening layer and the LUMO energy level differences between the second transport layer and the roughening layer is smaller than 0.3 eV, preferably smaller than 0.1 eV (all are absolute values).

In case the roughening layer is hole transporting (it comprises a hole transport material as its matrix material) it is preferred that the HOMO energy level differences between the first transport layer and the roughening layer and the HOMO energy level differences between the second transport layer and the roughening layer is smaller than 0.3 eV, preferably smaller than 0.1 eV (all are absolute values). roughening layer is electron transporting (it comprises an electron transport material as its matrix material) it is preferred that the LUMO energy level differences between the first transport layer and the roughening layer and the LUMO energy level differences between the second transport layer and the roughening It is preferred that the roughening organic layer crystallizes during the evaporation. Alternatively a tempering step can follow the deposition of the roughening organic layer and precede the deposition of the next layer.

The property of "crystallization" is to be understood as a layer which is very rough. A preferred RMS roughness is between the magnitude of the layer thickness and 3 times the layer thickness. The roughness is measured on a linear path of 20 μm. Some individual clusters can be formed with a size of approximately 100 nm to approximately 1 μm.

A material according to formula (I) is preferred.

OLEDs

OLEDs are based on the principle of electroluminescence in which electron-hole pairs, so-called excitons, recombine under the emission of light. To this end the OLED is constructed in the form of a sandwich structure wherein at least one organic film is arranged as active material between two electrodes, positive and negative charge carriers are injected into the organic material and a charge transport takes place from holes or electrons to a recombination zone (light emitting layer) into the organic layer where a recombination of the charge carriers to singlet and/or triplet excitons occurs under the emission of light. The subsequent radiant recombination of excitons causes the emission of light. At least one of the electrodes must be transparent enabling the light to leave the component. Typically, a transparent electrode consists of conductive oxides designated as TCOs (transparent conductive oxides), or a very thin metal electrode, however other materials can be used. The starting point in the manufacture of an OLED is a substrate on which the individual layers of the OLED are deposited. If the electrode nearest to the substrate is transparent, the component is designated as a "bottom-emitting OLED" and if the other electrode is transparent the component is designated as a "top-emitting OLED". The bottom electrode is closer to the substrate than the top electrode. The bottom electrode is formed (deposited) before the formation (deposition) of the top electrode The most reliable and efficient OLEDs are those comprising doped layers. By electrically doping hole transport layers with a suitable acceptor material (p-doping) or electron transport layers with a donor material (n-doping), respectively, the density of charge carriers in organic solids (and therefore the conductivity) can be increased substantially. Additionally, analogous to the experience with inorganic semiconductors, applications can be anticipated which are precisely based on the use of p- and n-doped layers in a component and otherwise would be not conceivable. The use of doped charge-carrier transport layers (p-doping of the hole transport layer by admixture of acceptor-like molecules, n-doping of the electron transport layer by admixture of donor-like molecules) in organic light-emitting diodes is described in US 2008/203406 and U.S. Pat. No. 5,093,698.

The materials used in the arrangement of layers are conventional materials used in OLEDs which materials or mixtures thereof satisfy the functions of the layers such as injection layers, transport layers, emitting layers, connecting units, etc. For examples of such layers and materials, refer to US2009045728, US20090009072, EP1336208, and references therein.

Bottom Emitting OLED and Roughening Layer

A lighting device comprising one or more devices of this type is preferred.

Preferably, the OLED is bottom emitting, meaning that the bottom electrode is transparent, at least for the light which is desired to be outcoupled from the device; and the top electrode is reflective, at least for some of the emitted wavelengths of the device. Typically, "transparent" means an average transmittance greater than 80% in the visible; and "reflective" means an average reflectivity greater than 80% in the visible.

The top electrode is preferably a metal electrode, which has some degree of roughening created by the template of the roughening organic layer. The effect of roughening which is essential for the invention is not created by a template of the bottom electrode, the substrate or the top electrode itself. The roughness of the top electrode is distinguished from a normal roughness in which the top electrode is deposited over conventional layers used in the arrangement of layers, such as organic transport materials, or organic or inorganic injection materials.

It is preferred that the material of the roughening organic layer is electrically doped.

It is preferred that an intermediate layer comprising an electrically doped organic material is disposed between the roughening organic layer and the top electrode. It was surprisingly found that the roughening organic layer does not adversely affect the charge carrier transport.

The device can be formed as a non-inverted structure or as an inverted structure. In the case of the non-inverted structure, the bottom electrode is the anode and the top electrode is the cathode. In the inverted structure, the bottom electrode is the cathode and the top electrode is the anode.

A preferred embodiment of the invention provides the inverted structure with a roughening organic layer which is formed between the organic light-emitting layer and the top electrode (anode) as a hole transport layer. Another embodiment provides the non-inverted structure with a roughening organic layer which is formed between the organic light-emitting layer and the top electrode (cathode) as an electron transport layer.

The electrode located closer to the substrate than the top electrode is designated as bottom electrode.

In a preferred embodiment the roughening organic layer is formed uniformly from a material having a single molecular structure.

It is preferred that all the organic layers in the arrangement of stacked layers are fabricated by means of evaporation in vacuum (VTE—vacuum thermal evaporation). Alternatively, all the organic layers in the arrangement of stacked layers can be fabricated by means of OVPD. In a preferred embodiment all the organic layers and both electrodes are deposited in a vacuum coating process, for example, VTE or sputtering.

It is further preferred that the roughening organic layer is formed as vapour-deposited layer from an organic material which can be evaporated by means of thermal evaporation in vacuum. For this purpose the material has an evaporation (or sublimation) temperature in vacuum that is lower than the decomposition temperature in vacuum.

Alternatively or additionally, the roughening organic layer can be fabricated by means of OVPD.

It is preferred that the roughening organic layer is formed from small molecules and is polymer-free. In one embodiment, the roughening organic layer is preferably fabricated free from liquid processing.

It is preferred that the roughening organic layer is made of an organic material which has a Tg below about 40° C. Preferably a material having no Tg is used. In this way, the organic material can crystallise out itself during vapour deposition onto the substrate without any further tempering step since in conventional VTE systems the substrate temperature is usually between 20° C. and 60° C.

The Tg is determined by means of a DSC measurement. The DSC measurement is performed using a material which after fusing, is brought to room temperature by means of shock cooling. Thereafter the material is heated during the measurement at a rate of 10 K/min. In the preferred materials used in the roughening organic layer, no Tg was observed.

It is preferred that the roughening organic layer crystallises during the vapour deposition. Alternatively, a tempering step can follow after the completion of the layer and before the deposition of the next layer.

The property "crystallises" is understood to mean that the layer is very rough. An RMS roughness in a range between the layer thickness and approximately three times the layer thickness is preferably given. The roughness is measured on a linear section of about 20 µm. In this case, individual clusters can have a size of about 100 nm to about 1 µm.

The roughening organic layer is formed from a material as described above.

The roughening organic layer differs by no more than 0.5 eV from the LUMO of the neighbouring layers. The LUMO can, however, differ by more than 0.5 eV if the material can be efficiently n-doped. If the material of the roughening organic layer is an ETL (is used as an ETL), it is then preferred that the LUMO differs by no more than 0.5 eV from the LUMO of the neighbouring layers. The LUMO can, however, differ by more than 0.5 eV if the material can be efficiently n-doped.

If the material of the roughening organic layer is an HTL (is used as an HTL), it is then preferred that the HOMO differs by no more than 0.5 eV from the HOMO of the neighbouring layers. The HOMO can however differ by more than 0.5 eV if the material can be efficiently p-doped.

Consequently, preferred variants have the following layer structure:

n-doped roughening organic layer/n-doped ETL/cathode, where "/" designates a touching contact, i.e., no other layer in between.

Preferred materials for the roughening organic layer are described hereinafter.

The roughening layer is, preferably formed from molecules whose chemical structure is a linear condensed ring system having less than five rings. A material whose chemical structure allows at least one axial rotation along a principal axis can also be used.

In the case where the roughening organic layer also forms an electron transport layer (ETL) (between cathode and organic light-emitting layer), for the roughening organic layer it is preferable to use materials from the class of bridged bisoxazoles (and higher homologues thereof) in particular 1,4-di(benzo[d]oxazol-2-yl)benzene.

In the case where the roughening organic layer also forms a hole transport layer (HTL) (between anode and organic light-emitting layer), for the roughening organic layer it is preferable to use materials from the class of benzanelated oxathiines (and higher homologues thereof), in particular 5,12-dioxa-7,14-dithia-pentacene, 2,2'-(perfluorocyclohexa-2,5-diene-1,4-diylidene)dimalononitrile, and 1,4-bis(benzo[d]oxazol-2-yl)naphthalene. In another embodiment the benzanelated oxathiines are excluded In a preferred embodiment, the following compounds shall be excluded:

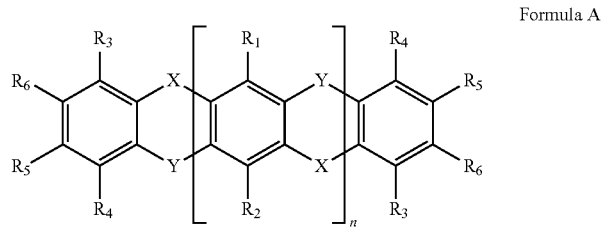

Formula A

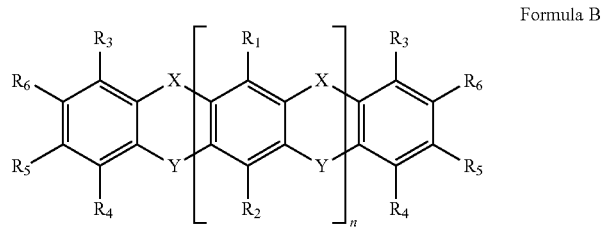

Formula B

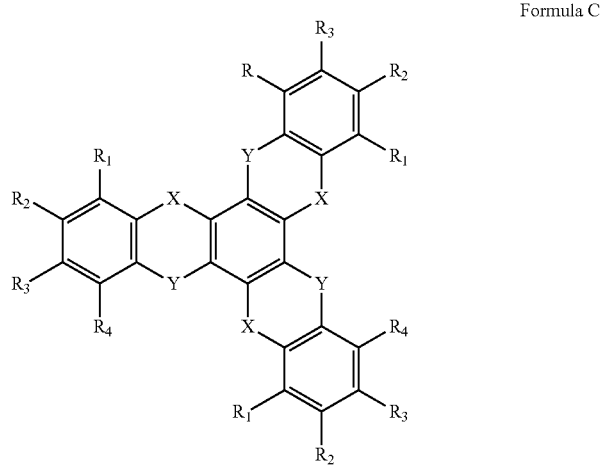

Formula C

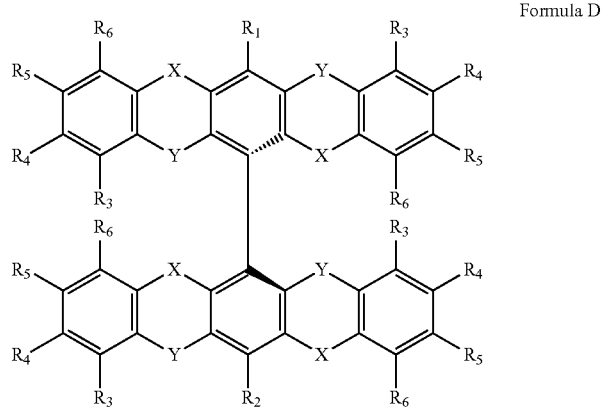

Formula D

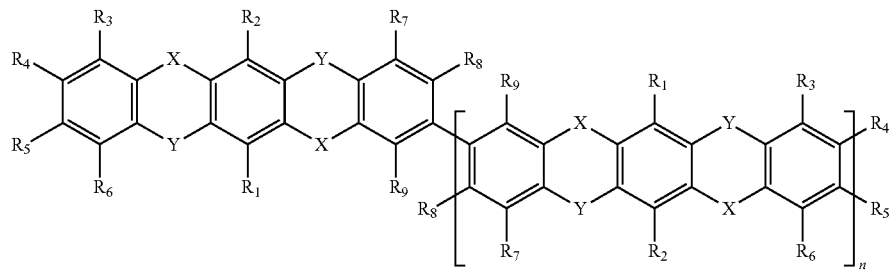

Formula E wherein X and Y are different from each other, but are otherwise independently selected from oxygen, sulphor, selenium and tellurium; n is 1, 2, 3, 4, 5 or 6; and $R_{19}$ are independently selected from hydrogen, alkyl, aryl, heteroaryl, fused carbocycle, fused heterocycle, OR', SR' and $NR_2$', wherein R' is independently selected from alkyl, aryl, heteroaryl, fused carbocycle and fused heterocycle.

It is furthermore preferred that the roughening organic layer is between 3 nm and 30 nm thick. Where the layer thickness is a nominal layer thickness, this is calculated from the mass which is deposited on a known area size, for which the thickness of the material is used. For example, by VTE fabrication the layer thickness is that displayed in the layer thickness monitor. In practice the layer thickness is difficult to measure because the layers are very rough, and possibly the average must be used.

Preferred materials for the substrate, the electrodes and other organic semiconducting materials are described hereinafter.

The top electrode is a light-reflecting electrode, preferably a metal electrode.

There is preferably an HTL between the roughening organic layer and the anode if the roughening organic layer is an HTL. The HTL is furthermore preferably p-doped. Typical materials for the HTL are, for example, phthalocyanines; triphenylamines, spiro compounds.

There is preferably an ETL between the roughening organic layer and the anode if the roughening organic layer is an ETL. The ETL is furthermore preferably n-doped. Typical materials for the ETL are, for example, phenanthrolines, heterosubstituted phenanthrolines, metal complexes.

ETL between the roughening organic layer and the cathode. The ETL is furthermore preferably n-doped. Typical materials for the ETL are, for example, phenanthrolines, heterosubstituted phenanthrolines, metal complexes.

In one embodiment, the substrate is glass.

In one embodiment the substrate has an optical refractive index in a range of about 1.4 to 1.8.

As a result of the use of the roughening organic layer according to the invention, not only the light outcoupling is improved but also the angular dependence of the light emission is improved. White light spectrum contains components of several light colours, typically however at least some blue, green and red light components. Since the emission characteristic is different for different wavelengths, different colours are seen at different viewing angles in conventional OLEDs. This is drastically reduced by the scattering properties of the inventive OLED.

The roughening organic layer improves the outcoupling of internal modes. It also improves the outcoupling of substrate modes. The roughening layer is also used so that the electronic properties of the OLED are not disturbed. It was further determined that an additional power gain is achieved with an outcoupling film, which cannot be achieved with usual outcoupling solutions (scattering layers). In contrast, in conventional OLEDs with scattering layers, there is no power gain if another additional outcoupling film is used.

With the invention, a simple structure is achieved to produce highly efficient OLEDs without requiring expensive methods, for example, microstructuring of the electrode-side substrate surface or the semiconductor-side electrode surface. A flat (non-microstructured) bottom electrode can also be used. Microstructuring is understood to mean structures which have a size in the range of optical wavelengths in order to influence the light.

No smoothing layer is formed between the roughening organic layer and the top electrode. These intermediate layers (preferably only one layer) transfer the roughness from the roughening organic layer to the top electrode and are responsible for an improvement of the charge carrier injection. It was further determined that the advantages of the invention have the strongest effect when the distance (orthogonal to the extension of the layer surface) between the top electrode and the nearest emitter layer to the top electrode is less than 100 nm, preferably 15 nm to 50 nm. It is therefore preferred that this distance is less than 100 nm, preferably in the range of 15 nm to 50 nm.

Embodiments for the Bottom Emitting OLED

The invention is explained in detail hereinafter by means of exemplary embodiments with reference to figures of a drawing. In the figures:

Figures 1, 2:
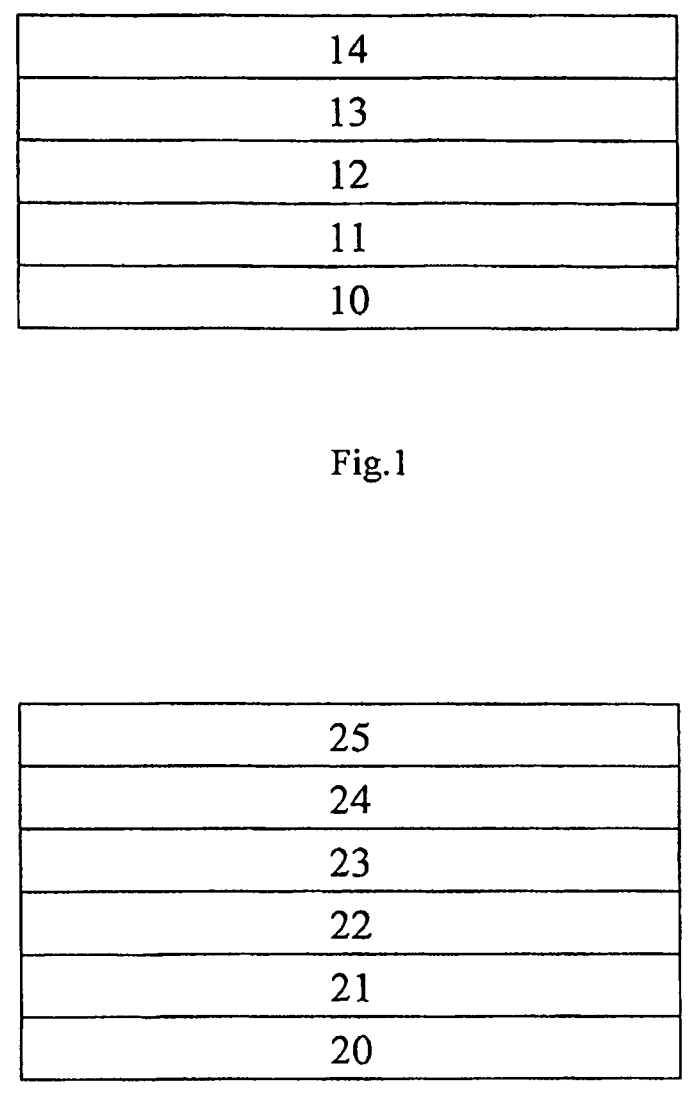

FIG. 1 shows a schematic diagram of the layer structure of an OLED comprising an arrangement of stacked layers on a substrate (10), comprising: a bottom electrode (11), an organic layered structure (12), a roughening organic layer (13), a top electrode (14), FIG. 2 shows a schematic diagram of the layer structure of an OLED comprising an arrangement of stacked layers on a substrate (20), comprising: a bottom electrode (21), an organic layered structure (22), a roughening organic layer (23), an intermediate layer (24) of an organic semiconducting material, a top electrode (25), and FIG. 3 shows a schematic diagram of the layer structure of an OLED comprising an arrangement of stacked layers on a substrate (30), comprising: a bottom electrode (31), a roughening organic layer (32), an organic layered structure (33), a top electrode (34).

The organic layered structure (12, 22, 32) must contain at least one light-emitting layer. Typical layered structures for OLEDs are described in EP 1 705 727, EP 1 804 309. The OLED can also have a p-i-n layered structure, which is described for example in U.S. Pat. No. 7,074,500, US 2006/250076. The n- and p-dopants used in a p-i-n OLED are described, for example, in U.S. Pat. No. 6,908,783, US 2008/265216, WO 07/107,306, EP 1 672 714.

Preferred Compounds

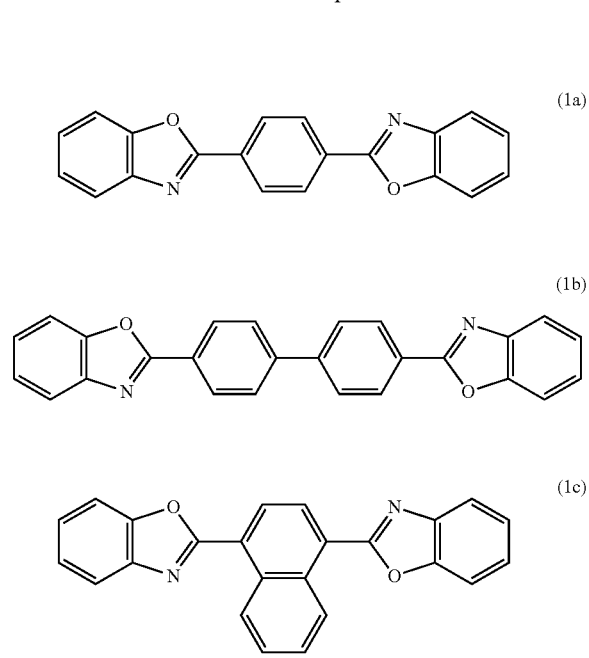

(1a)

(1b)

(1c)

Synthesis of 1a

First Step

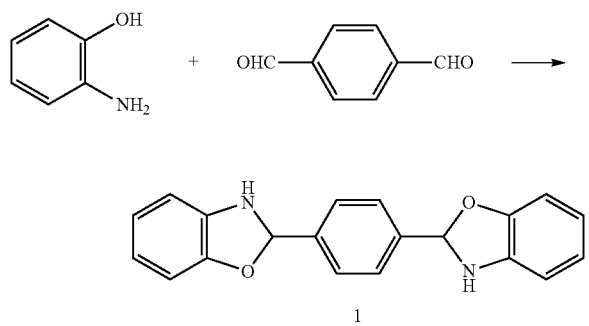 [SMILES: Nc1ccccc1O ; O=Cc1ccc(C=O)cc1 ; c1ccc2c(c1)NC(c1ccc(C3Nc4ccccc4O3)cc1)O2]

2 g (14.9 mmol) of p-terephthaldehyde were put in a 200 mL flask, together with 50 mL warm distilled water. The white suspension was heated up to 50° C. In another 100 mL flask were mixed 3.26 g (29.8 mmol) of 2-aminophenol and warm distilled water (50° C.) to obtain a brownish suspension. The second suspension was added to the first, which cause a fast precipitation of a yellow substance. The obtained suspension was boiled 5 hours at reflux (105° C.). The precipitate gets very thick during the course of the reaction. The suspension is filtered and washed with Methanol (50 mL) and dried overnight.

Yield: 4.3 g (92%) Yellow powder

ESI: M+: 315 and 317

Second Step

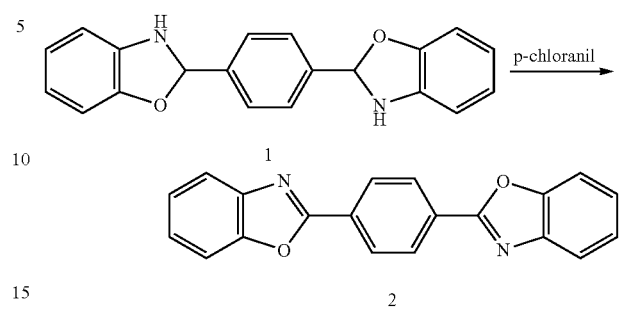

2.3 g of 1 (7.3 mmol) were placed together with 3.59 g of p-chloranil (14.5 mmol) in a 250 mL flask. 50 45 mL of 1,2-dichlorobenzene. The mixture was refluxed (200° C.) for 22 hours. The brown suspension is then let cooled down to room temperature. 100 mL methanol were then added and the mixture was stirred for an additional 30 min at RT. The suspension is then filtered and the residual brown substance was then washed twice with 10 mL methanol before being dried overnight.

Yield: 1.99 g (87%) off white solid.

Sublimation: 70% yield provides a very light yellow material

Mp: 351° C.

LUMO vs Fc: −2.13 V (reversibile)

Examples for Some Embodiments

All examples were fabricated using VTE.

A top emitting white OLED was made with the following stack of layers on a glass substrate:

(1) 100 nm Ag as anode (bottom electrode)

(2) 60 nm N,N'-Bis(naphthalen-1-yl)-N,N'-bis(phenyl)-benzidine (α-NPD) doped with 2,2'-(perfluorocyclohexa-2,5-diene-1,4-diylidene)dimalononitrile (F4-TCNQ).

(3) 10 nm α-NPD (4) 20 nm light emitting layer composed of 3 sublayers, each with a different combination of materials to enable a broad white emission.

(5) 10 nm 2,7,9-triphenyl-4-(p-tolyl)pyrido[3,2-h]quinazoline (6) 30 nm 2,7,9-triphenyl-4-(p-tolyl)pyrido[3,2-h]quinazoline doped with W(hpp)4 (Tetrakis(1,3,4,6,7,8-Hexahydro-2H-pyrimido[1,2-a]pyrimidinato)ditungsten (II))

(7) 12 nm Ag as cathode (top electrode)

(8) 400 nm compound (1a)

A comparative device without layer 8 showed a much higher angular dependency on the emitted color and a 30% lower power efficiency than the inventive device. Similar results are obtained on metal substrates.

In another experiment, a device was fabricated with the same structure as the inventive device above with an additional layer of 250 nm of polymethylmetacrylate between layers 7 and 8. The additional layer gives an additional protection to the top emitting OLED and at the same time optically couples the light emitted from the cathode into the scattering layer (8).

A white OLED was made with the following stack of layers on a glass substrate:
(1) ITO as anode (bottom electrode)
(2) 60 nm α-NPD F4-TCNQ
(3) 10 nm α-NPD
(4) 20 nm light emitting layer composed of 3 sublayers, each with a different combination of materials to enable a broad white emission.
(5) 10 nm 2,7,9-triphenyl-4-(p-tolyl)pyrido[3,2-h]quinazoline
(6) 20 nm compound (1b)
(7) 10 nm 2,7,9-triphenyl-4-(p-tolyl)pyrido[3,2-h]quinazoline doped with W(hpp)4
(8) 100 nm Ag as cathode (top electrode)

A comparison was made with another OLED with similar stack, where layer (6) was not used, and layer 5 had a thickness of 30 nm. The inventive device showed an increased power efficiency of 15%.

Additional experiments showed similar results with compounds (1a) and (1c).

16 green, bottom emitting OLEDs were fabricated with following layer structure over a glass substrate:
(1) 120 nm ITO as anode
(2) 70 nm tetrakis(4-methoxyphenyl)biphenyl-4,4'-diamine doped with 4% F4-TCNQ
(3) 10 nm α-NPD
(4) 20 nm TCTA doped with 10% fac-tris(2-phenylpyridine) iridium (Ir(ppy)$_3$)
(5) 10 nm 2,7,9-triphenyl-4-(p-tolyl)pyrido[3,2-h]quinazoline
(6) 20 nm compound (1c) doped with W(hpp)4
(7) 20 nm 2,7,9-triphenyl-4-(p-tolyl)pyrido[3,2-h]quinazoline doped with W(hpp)4
(8) 100 nm Ag as cathode Comparative devices were fabricated without layer (6) and modifying the thickness of layer (7) to 40 nm.

Although the layer (6) has a high roughness, the production yield was 100%, and the devices showed improved power efficiency in view of comparative devices.

In another example, a green inverted OLED, was fabricated with the following stack:
(1) ITO as cathode (bottom electrode)
(2) 20 nm compound (1c) doped with W(hpp)4
(3) 10 nm 2,7,9-triphenyl-4-(p-tolyl)pyrido[3,2-h]quinazoline
(4) 10 nm α-NPD doped with 10% fac-tris(2-phenylpyridine) iridium (Ir(ppy)$_3$)
(6) 10 nm α-NPD
(7) 60 nm α-NPD doped with F4-TCNQ.
(8) 100 nm Ag as anode (top electrode)

Comparative devices were fabricated using 2,7,9-triphenyl-4-(p-tolyl)pyrido[3,2-h]quinazoline instead of compound (1c) in layer (2). The inventive devices showed an increase in power efficiency of 23%.

Examples for Inventive Bottom Emitting OLEDs

A white OLED was fabricated with the following layer structure on a glass substrate:
(1) ITO as anode
(2) 60 nm N,N'-bis(naphthalen-1-yl)-N,N'-bis(phenyl)-benzidine (α-NPD) doped with 2,2'-(perfluorocyclohexa-2,5-diene-1,4-diylidene)dimalononitrile.
(3) 10 nm α-NPD
(4) 20 nm emitter layer consisting of three regions having different emitter dopants so that white light is generated.
(5) 10 nm 2,7,9-triphenyl-4-(p-tolyl)pyrido[3,2-h]quinazoline
(6) 10 nm 2,7,9-triphenyl-4-(p-tolyl)pyrido[3,2-h]quinazoline doped with tetrakis(1,3,4,6,7,8-hexahydro-2H-pyrimido[1,2-a]pyrimidinato)ditungsten (II) (W(hpp)4)
(7) x nm 1,4-di(benzo[d]oxazol-2-yl)benzene doped with W(hpp)4
(8) 10 nm 2,7,9-triphenyl-4-(p-tolyl)pyrido[3,2-h]quinazoline doped with W(hpp)4
(9) 100 nm Ag as cathode The layer thicknesses of layers (6) and (7) were adapted to the layer thickness (7) so that the results are comparable and not affected by a change of optical cavity.

A glass substrate having a refractive index n=1.5 was used.

FIG. 3 shows the power and quantum efficiency of OLEDs with and without the roughening organic layer. The OLEDs were also measured with an external outcoupling film. All the measurements were made using an Ulbricht sphere. The results are summarised in the following table:

| Reference to FIG. 3 | Description | X | Peff (lm/W) | EQE (%) |
| --- | --- | --- | --- | --- |
| 31 | Without outcoupling film | 0 nm | 24.8 | 10.1 |
| 32 | Outcoupling film | 0 nm | 34.8 | 14.4 |
| 34 | Without outcoupling film | 5 nm | 27.9 | 12.1 |
| 35 | Outcoupling film | 5 nm | 38.0 | 16.6 |
| 37 | Without outcoupling film | 7 nm | 30.3 | 12.9 |
| 38 | Outcoupling film | 7 nm | 38.7 | 16.6 |

As can be seen, the OLED with the roughening organic layer has an efficiency increase of ~20%.

Further Development of the Invention

In a further development of the invention, it was found that it is not necessary to provide the roughening organic layer in a layer very close to the top electrode. It was found that the roughening organic layer can be provided in the layers of the arrangement of layers which is between two emitting units (each comprising at least one emitting layer) in a stacked OLED.

In addition, at least one additional roughening organic layer can be provided in different layers of the arrangement of layers, which different layers are in different locations in relation to the light emitting units. For instance a roughening organic layer can be provided between two light emitting units, and an additional roughening organic layer can be provided between the top electrode and the light emitting unit closest to the top electrode.

Example of an Stacked OLED:

Different OLEDs were fabricated with the following arrangement of layers (the variables, X, Y, Z refer to the layer thickness shown in the tables below):
 ITO as bottom electrode (anode);
 130 nm thick 1 mol % p:doped 1 mol % hole transport layer. The dopant was 2,2',2"-(cyclopropane-1,2,3-triylidene)tris(2-(p-cyanotetrafluorophenyl)acetonitrile) (PT1) and the transport material was a-NPD;
 10 nm undoped a-NPD;
 a 25 nm thick fluorescent blue emitter system;
 10 nm undoped 4-(naphthalen-1-yl)-2,7,9-triphenylpyrido[3,2-h]quinazoline (ET1);
 10 nm of ET1 n-doped with 8 mol % of Tetrakis(1,3,4,6,7,8-Hexahydro-2,1-pyrimido[1,2-a]pyrimidinato)ditungsten (II) (NT1), as n:ETL;
 X nm of RM2, as organic roughening layer 1;
 10 nm ET1 n-doped with 8 mol % NT1, as n:ETL;
 20 nm of α-NPD p-doped 6 mol % with PT1;

50 nm phosphorescent green emitter system;
10 nm of 2,4,7,9-tetraphenyl-1,10-phenanthroline (ET2), as HBL;
35 nm ET1 n-doped with 8 mol % NT1, as n:ETL;
Y nm of RM2, as organic roughening layer. 2;
35 nm ET1 n-doped with 8 mol % NT1, as n:ETL;
20 nm of α-NPD p-doped 6 mol % with PT1;
30 nm of an orange phosphorescent emitter system;
10 nm of ET2;
40 nm ET1 n-doped with 8 mol % NT1, as n:ETL;
Z nm of RM2, as organic roughening layer 3;
15 nm ET1 n-doped with 8 mol % NT1, as n:ETL;
100 nm Ag as top electrode (cathode).

The quantum efficiencies of the devices are shown in the table below for different thicknesses of the organic roughening layer:

Quantum Efficiency at 1000 cd/m2

| | X → | | | |
|---|---|---|---|---|
| Z ↓ | 0 | 5 | 10 | 15 |
| 0 | 35.7 | 39.8 | 39.9 | 36.0 |
| 5 | 39.7 | 40.3 | 37.9 | 33.9 |
| 10 | 39.1 | 38.4 | 35.8 | 31.6 |
| 15 | 37.9 | 35.9 | 33.6 | 29.5 |

It can be observed how the effect of improving efficiency is related to the layer thickness (X,Z) which is additive. Best performances are obtained at a total thickness (X+Z) greater or equal to 5 nm and smaller or equal to 15 nm, with considerable lower performance at 0 nm or 20 nm.

At Z=5 nm

| | X→ | | | |
|---|---|---|---|---|
| Z ↓ | 0 | 5 | 10 | 15 |
| 0 | 39.7 | 40.3 | 37.9 | 33.9 |
| 5 | 40.1 | 39.2 | 36.1 | 31.8 |
| 10 | 40.4 | | | |
| 15 | 33.5 | | | |

The table above shows that a roughening layer (roughening layer 2) also provides the desired effect when provided between the two emission units.

The following two tables show the same behaviour of the power efficiency as for the quantum efficiency.

Power efficiency at 1000 cd/m2 (lm/W)

| | X → | | | |
|---|---|---|---|---|
| Z ↓ | 0 | 5 | 10 | 15 |
| 0 | 29.7 | 32.1 | 30.2 | 25.9 |
| 5 | 32.4 | 32.2 | 28.5 | 24.2 |
| 10 | 31.6 | 30.3 | 26.7 | 22.4 |
| 15 | 30.4 | 28.0 | 24.8 | 20.8 |

At Z=5 nm

| | X → | | | |
|---|---|---|---|---|
| Z ↓ | 0 | 5 | 10 | 15 |
| 0 | 32.4 | 32.2 | 28.5 | 24.2 |
| 5 | 32.4 | 32.2 | 28.5 | 24.2 |
| 10 | 33.9 | | | |
| 15 | 28.6 | | | |

It is interesting to observe that the effect cannot only be explained by a modification of the length of the internal optical cavity. Moreover, this effect is not exhausting the possibilities of further providing external means for improving light outcoupling.

Contrary to most of techniques to improve light outcoupling, in which the adding different means do not provide an additive effect on the performance of the OLED, in the present invention, it was surprisingly found that the inventive OLEDs can be further considerably improved.

By adding an external outcoupling foil comprising a micro lense array to improve the extraction of the light, it was possible to almost double the efficiency of the best OLEDs as described above by a factor of 1.5, obtaining a power efficiency of above 50 lm/W.

The features of the invention disclosed in the preceding description, the claims and the drawings can be of importance both individually and in any combination for the implementation of the invention in its various embodiments.

The invention claimed is:

1. An organic light emitting device comprising a layered structure comprising:
   a substrate,
   a bottom electrode and a top electrode, wherein the bottom electrode is closer to the substrate than the top electrode,
   an electronically active region, the electronically active region being provided between and in electrical contact with the bottom electrode and the top electrode,
   at least one light emitting layer, the at least one light emitting layer being provided in the electronically active region,
   a top electrically doped transport and/or injection layer, the top electrically doped transport and/or injection layer being provided in the electronically active region, and
   a roughening organic layer, wherein the roughening organic layer is provided in the electronically active region, made of a self-crystallizing organic material, and provided with a thickness of less than 50 nm,
   wherein the top electrically doped transport and/or injection layer is provided between the roughening organic layer and the top electrode.

2. The organic light emitting device according to claim 1, wherein the roughening organic layer is provided between the at least one light emitting layer and the top electrode.

3. The organic light emitting device according to claim 1, wherein the roughening organic layer is provided between the at least one light emitting layer and the bottom electrode.

4. The organic light emitting device according to claim 1, wherein the roughening organic layer has a thickness equal to or less than 10 nm.

5. The organic light emitting device according to claim 1, wherein the roughening organic layer comprises an electrical dopant.

6. The organic light emitting device according to claim 1, wherein the roughening organic layer is adjacent to and in direct contact with a first and a second electron transport layer.

7. The organic light emitting device according to claim 1, wherein an electron transport layer is adjacent to and in direct contact with a cathode and the roughening organic layer.

8. The organic light emitting device according to claim 1, wherein the roughening organic layer comprises a chemical compound which has a glass transition temperature of below 40° C., does not present any measurable glass transition temperature at temperatures above room temperature, or has no Tg at all.

9. The organic light emitting device according to claim 1, wherein the roughening organic layer comprises a chemical compound according to formula (I):

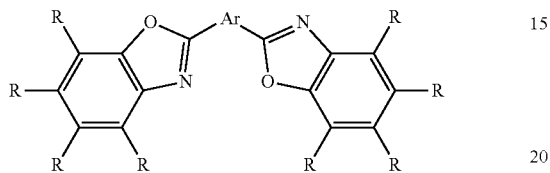

wherein Ar is $C_6$-$C_{20}$ aryl and each R is independently selected from H, $C_1$-$C_{20}$ alkyl, $C_6$-$C_{20}$ aryl, $C_5$-$C_{20}$ heteroaryl, halogen, nitro, CN, and amine.

* * * * *